(12) United States Patent
Zhuang

(10) Patent No.: US 7,598,174 B1
(45) Date of Patent: Oct. 6, 2009

(54) FEATURE PATTERNING METHODS

(75) Inventor: Haoren Zhuang, Hopewell Junction, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/127,547

(22) Filed: May 27, 2008

(51) Int. Cl.
*H01L 21/302* (2006.01)

(52) U.S. Cl. .................. 438/689; 438/620; 438/622; 438/637; 438/700; 257/E21.579

(58) Field of Classification Search ............ 438/620
See application file for complete search history.

(56) References Cited

U.S. PATENT DOCUMENTS

| 6,479,860 | B2 | 11/2002 | Ohbayashi |
| 6,743,711 | B2 * | 6/2004 | Kim ............... 438/637 |
| 6,767,825 | B1 * | 7/2004 | Wu ............... 438/633 |
| 6,787,469 | B2 | 9/2004 | Houston et al. |
| 6,942,958 | B2 | 9/2005 | Chen et al. |
| 2008/0286698 | A1 | 11/2008 | Zhuang et al. |
| 2008/0305623 | A1 | 12/2008 | Zhuang et al. |

OTHER PUBLICATIONS

Zhuang, H., et al., "Patterning Strategies for Gate Level Tip-Tip Distance Reduction in SRAM Cell for 45nm and Beyond," International Semiconductor Technology Conference (ISTC) 2007, Mar. 18-20, 2007, 2 pp., Electrochemical Society, Inc., Shanghai, China.

* cited by examiner

*Primary Examiner*—N Drew Richards
*Assistant Examiner*—Kyoung Lee
(74) *Attorney, Agent, or Firm*—Slater & Matsil, L.L.P.

(57) ABSTRACT

Methods of patterning features, methods of patterning material layers of semiconductor devices, and methods of manufacturing semiconductor devices are disclosed. In one embodiment, a method of patterning features includes providing a workpiece having a material layer disposed thereon. A hard mask is formed over the material layer. A first pattern is formed in an upper portion of the hard mask, and a second pattern is formed in the upper portion of the hard mask. The first pattern and the second pattern are formed in a lower portion of the hard mask and the material layer, forming the features in the material layer.

25 Claims, 10 Drawing Sheets

FEATURE PATTERNING METHODS

TECHNICAL FIELD

The present invention relates generally to the fabrication of semiconductor devices, and more particularly to the patterning of features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region, and a gate formed over the gate dielectric. A source region and a drain region are formed on either side of the channel region within a substrate or workpiece.

One challenge in the fabrication of transistors is the patterning of transistor gates. The overlapping regions of transistor gates with underlying isolation regions and active regions formed in a workpiece are particular areas of concern in some applications, because it is important for the various material layers to align correctly in order for the device to operate properly.

Furthermore, punch-through or undesired removal of top portions of a workpiece and other material layers during etch processes used to pattern transistor gates and other features may degrade device performance or lead to device failures.

Thus, what are needed in the art are improved methods of patterning transistor gates and other features of semiconductor devices.

SUMMARY OF THE INVENTION

These and other problems are generally solved or circumvented, and technical advantages are generally achieved, by embodiments of the present invention, which provide novel methods of patterning features, method of patterning material layers of semiconductor devices, and methods of manufacturing semiconductor devices.

In accordance with one embodiment of the present invention, a method of patterning features includes providing a workpiece having a material layer disposed thereon. A hard mask is formed over the material layer. A first pattern is formed in an upper portion of the hard mask, and a second pattern is formed in the upper portion of the hard mask. The first pattern and the second pattern are formed in a lower portion of the hard mask and the material layer, forming the features in the material layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments of the present invention in a specific context, namely in the patterning of transistor gates of SRAM devices. The invention may also be applied, however, to the patterning of other features of semiconductor devices, particularly features having a repeating pattern and comprising small sizes, e.g., reaching the resolution limits of the lithography system and processes used to pattern the device features. Embodiments of the invention may also be implemented in other semiconductor applications such as other types of memory devices, logic devices, mixed signal, and other applications, as examples.

Embodiments of the present invention provide methods for patterning features of a semiconductor device using a novel triple etch process. Two patterning steps, using two masking layers, two lithography masks, and two etch processes, are used to pattern an upper portion of a hard mask with a first pattern and a second pattern. A third etch process is used to transfer the first and second patterns to the remainder of the hard mask and to an underlying material layer, forming features in the material layer.

Figure 1:
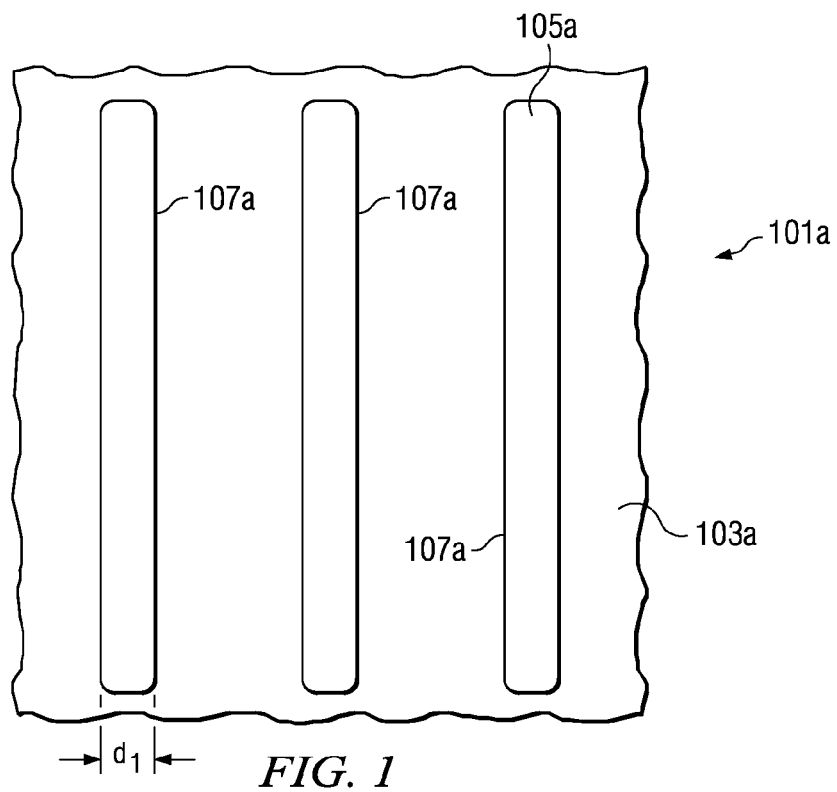
FIGS. 1 and 2 show top views of lithography masks in accordance with an embodiment of the present invention, wherein one mask comprises a width-defining mask for features and the other mask comprises a length-defining mask for features.
Figure 2:
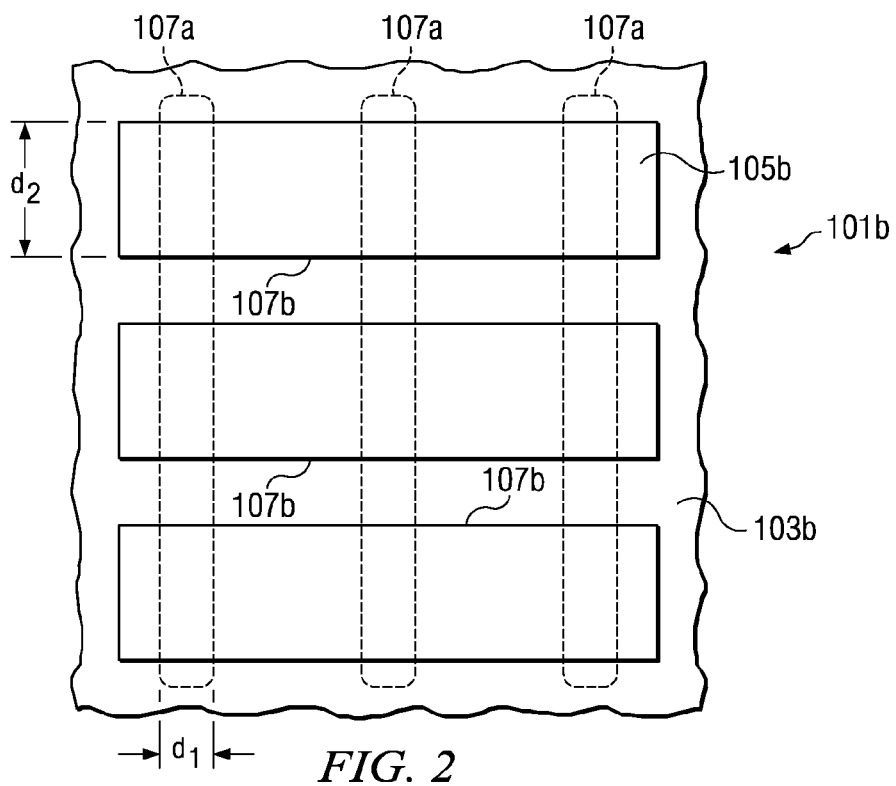

FIGS. 1 and 2 show top views of lithography masks 101a and 101b in accordance with an embodiment of the present invention. The lithography mask 101a shown in FIG. 1 may comprise a width-defining mask. The lithography mask 101b shown in FIG. 2 may comprise a length-defining mask and is also referred to herein as a "cutter mask."

Referring first to FIG. 1, a lithography mask 101a in accordance with one embodiment of the present invention is shown in a top view. The lithography mask 101a comprises a bright field binary mask that includes a substantially opaque material 105a attached or coupled to a substantially transparent material 103a. The substantially opaque material 105a may comprise a material that is opaque to light or energy, such as chromium or other opaque material. The substantially transparent material 103a may comprise a transparent material such as quartz or glass, although other materials may also be used. The lithography mask 101a may also comprise an attenuating mask, a dark field mask, or other types of masks, as examples, not shown.

The opaque material 105a of the lithography mask 101a in accordance with an embodiment of the present invention comprises a portion of a pattern 107a for a plurality of transistor gates formed thereon. The pattern 107a of the lithography mask 101a defines the widths of the transistor gates, yet does not define the lengths of the transistor gates, for example. The pattern 107a of the lithography mask 101a may comprise a pattern for elongated, substantially rectangular transistor gates, for example, as shown.

The pattern 107a may comprise a plurality of opaque features formed in the opaque material 105a. The patterns 107a for the features comprised of the opaque material 105a may be arranged in a plurality of columns, as shown in FIG. 1, or a plurality of rows. The patterns 107a for the features may comprise a plurality of opaque substantially rectangular shapes being elongated and having rounded ends, or the feature patterns may comprise other shapes, such as a plurality of square, round, elliptical, triangular, rectangular, polygonal, or trapezoidal features. Alternatively, the patterns 107a for the features in the opaque material 105a may also comprise other shapes, for example.

In some embodiments, the patterns 107a for the features may comprise a width (e.g., dimension $d_1$) along at least one side comprising a minimum feature size of the lithography system the manufacturing process will be used in, and the patterns 107a for the features may be spaced apart by the same minimum feature size, as an example. The width $d_1$ and spaces may also comprise dimensions greater than the minimum feature size, alternatively, as shown in FIG. 1. The patterns 107a for the features may comprise a width or dimension $d_1$ of about 100 nm or less, for example, although the patterns for the features in the opaque material 105a of the mask 101a may also comprise other dimensions.

The lithography mask 101a shown in FIG. 1 is also referred to herein as a first lithography mask or a width-defining mask. The pattern 107a in the opaque material 105a of the lithography mask 101a is also referred to herein as a first pattern or a first portion of a pattern, for example.

The patterns 107a for features in the opaque material 105a of the lithography mask 101a may also include small protrusions or serifs along their length or at their ends for optical proximity correction (OPC) in the lithography process, for example, not shown. The OPC structures are not printed on a material layer during a lithography process, but rather, compensate at least partially for diffraction effects in the lithography process and system.

Referring next to FIG. 2, a lithography mask 101b in accordance with an embodiment is shown in a top view. The lithography mask 101b comprises a bright field binary mask that includes a substantially opaque material 105b attached or coupled to a substantially transparent material 103b. The substantially opaque material 105b and the substantially transparent material 103b may comprise similar materials as described for the lithography mask 101a of FIG. 1. The lithography mask 101b may also comprise an attenuating mask, a dark field mask, or other types of masks, as examples, not shown.

The opaque material 105b of the lithography mask 101b in accordance with an embodiment of the present invention comprises a portion of a pattern 107b for a plurality of transistor gates formed thereon. The pattern 107b defines the lengths of the transistors, yet does not define the widths of the transistors, for example. The pattern of the lithography mask 101b may comprise a pattern 107b adapted to "cut" or segment the patterns 107a for elongated transistor gates of lithography mask 101a, shown in phantom, for example. Thus, the pattern 107b of the lithography mask 101b intersects the pattern 107a of lithography mask 101a shown in FIG. 1 in accordance with embodiments of the present invention.

The pattern 107b may comprise a plurality of opaque features formed in the opaque material 105b. The patterns 107b for the features comprised of the opaque material 105b may be arranged in a plurality of rows, as shown in FIG. 2, or a plurality of columns. The patterns 107b for features comprised of the opaque material 105b may be substantially perpendicular to the patterns 107a for features formed in the opaque material 105a of lithography mask 101a. The patterns 107b for the features may comprise a plurality of opaque substantially rectangular shapes being elongated and having rounded ends, or the feature patterns may comprise other shapes, such as a plurality of square, round, elliptical, triangular, rectangular, polygonal, or trapezoidal features. Alternatively, the patterns 107b for the features in the opaque material 105b may also comprise other shapes, for example.

In some embodiments, the patterns 107b for the features of the mask 101b may comprise a length (e.g., dimension $d_2$) along at least one side. The patterns 107b for the features may be spaced apart by a minimum feature size, as an example, such as dimension $d_1$ comprising the width of the first patterns 107a. Alternatively, the patterns 107b for the features may be spaced apart by dimensions greater than the minimum feature size. The patterns 107b for the features may comprise a length or dimension $d_2$ of about 500 nm or less, and may comprise a spacing between them, or a tip-to-tip distance, of about 150 nm or less in some applications, as examples, although the patterns 107b for the features in the opaque material 105b of the mask 101b may also comprise other dimensions.

The lithography mask 101b shown in FIG. 2 is also referred to herein as a second lithography mask or a cutter mask. The pattern 107b in the opaque material 105b of the lithography mask 101b of the second lithography mask 101b is also referred to herein as a second pattern or a second portion of a pattern, for example. The second pattern 107b comprises a different pattern than the first pattern 107a.

The patterns 107b for features in the opaque material 105b of the lithography mask 101b may also include small protrusions or serifs along their length or at their ends, for optical proximity correction (OPC) in the lithography process, for example, not shown. The OPC structures are not printed on a material layer during a lithography process, but rather, compensate at least partially for diffraction effects in the lithography process and system.

The patterns 107a and 107b in the lithography masks 101a and 101b, respectively, may comprise positive patterns in some embodiments, for example, wherein the patterns 107a and 107b in the opaque material 105a and 105b, respectively, represent regions where material on a hard mask of a semiconductor device will remain residing after a two-step etch process. For example, material may remain residing at the intersection of the patterns 107a and 107b in the two opaque materials 101a and 101b. Alternatively, the patterns 107a and 107b may comprise negative patterns (not shown).

Figure 3:
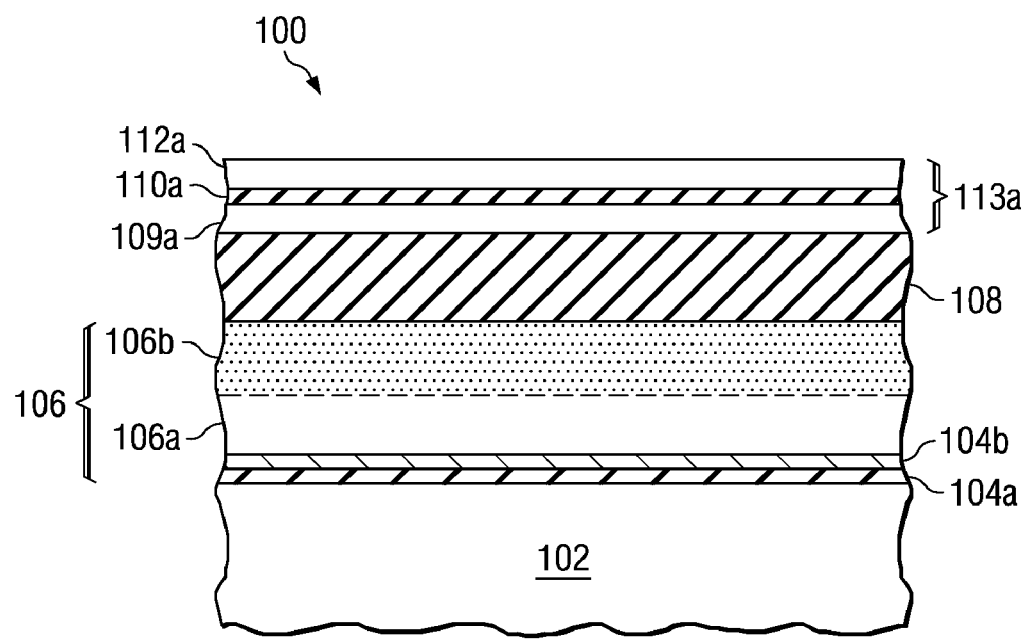
FIGS. 3 and 4 show cross-sectional views of a semiconductor device at various stages of manufacturing in accordance with an embodiment of the present invention, wherein the lithography mask shown in FIG. 1 is used to pattern an upper portion of a hard mask with a first pattern.
Figure 4:
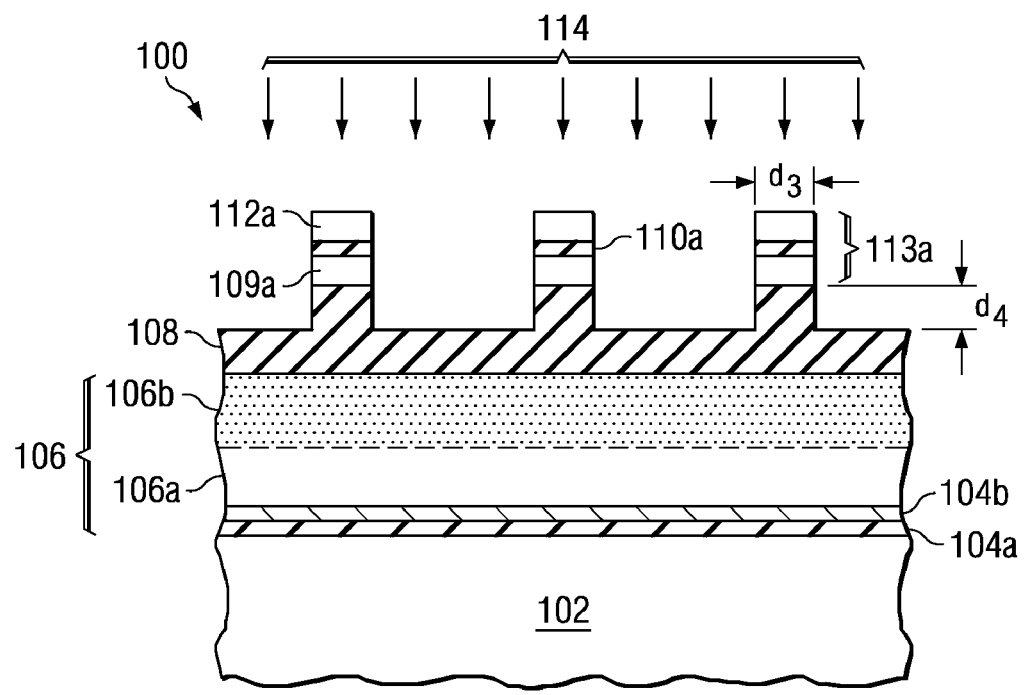

FIGS. 3 and 4 show cross-sectional views of a semiconductor device 100 at various stages of manufacturing in accordance with an embodiment of the present invention, wherein the lithography mask 101a shown in FIG. 1 is used to pattern an upper portion of a hard mask 108 with the first pattern 107a of the first lithography mask 101a. To manufacture a semiconductor device 100 using the mask 101a of FIG. 1, first, a workpiece 102 is provided, as shown in FIG. 3. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A material layer 106 to be patterned is disposed over the workpiece 102. For example, if the material layer 106 to be patterned comprises a portion of a transistor device, the material layer 106 includes a gate dielectric material 104a that is disposed over the workpiece 102, as shown. The gate dielectric material 104a may comprise an insulating material such as silicon dioxide, silicon nitride, a high dielectric constant (k) material having a dielectric constant of greater than about 3.9, or combinations or multiple layers thereof, as examples. Alternatively, the gate dielectric material 104a may comprise other materials. The gate dielectric material 104a may comprise a thickness of about 300 Angstroms or less, for example, although alternatively, the gate dielectric material 104a may comprise other dimensions. The gate dielectric material 104a may be optional in some semiconductor device designs, e.g., when the manufacturing method is used to pattern devices other than transistors or memory devices.

An optional metal layer 104b may be formed over the gate dielectric material 104a, as shown. The metal layer 104b may comprise about 300 Angstroms or less of a metal such as TiN, for example, although alternatively, the metal layer 104b may comprise other dimensions and materials. In embodiments wherein the gate dielectric material 104a comprises a high k dielectric, the optional metal layer 104b may be included in the material layer 106, for example. The metal layer 104b may be included when transistor gates to be formed comprise a metal high k (MHK) gate material, for example.

The material layer 106 includes a material 106a/106b that is disposed over the optional gate dielectric material 104a and the optional metal layer 104b. The material 106a/106b may be disposed directly over the workpiece 102 if a gate dielectric material 104a and metal layer 104b are not included, for example. The material 106a/106b may comprise a gate material, and in some embodiments comprises a semiconductive material such as silicon. The material 106a/106b may comprise an amorphous semiconductive material, a crystalline semiconductive material such as polysilicon, a conductor such as a metal, or combinations or multiple layers thereof, as examples. Alternatively, the material 106a/106b may comprise other materials. The material 106a/106b may comprise a thickness of about 1,500 Angstroms or less, for example, although alternatively, the material 106a/106b may comprise other dimensions.

Thus, the material layer 106 to be patterned may comprise a conductive material such as metal layer 104b, a semiconductive material such as layers 106a and 106b, an insulator such as gate dielectric layer 104a, or multiple layers or combinations thereof, as examples. The material layer 106 may comprise a single homogeneous layer of material, or the material layer 106 may comprise two or more material layers such as layers 106b, 106a, 104b and/or 104a.

The material layer 106 may comprise an upper portion 106b and a lower portion 106a disposed beneath the upper portion 106b, as shown. In embodiments where the material layer 106 to be patterned comprises a gate material, in some embodiments, the upper portion 106b of the material layer 106 may comprise a different material than the lower portion 106a. In embodiments wherein the gate dielectric material 104a comprises silicon dioxide or other non-high k materials, the upper portion 106b of the material layer 106 to be patterned may comprise a dopant material. For example, a dopant material may be implanted by ion implantation after the material layer 106 is deposited, or the material layer 106 may be doped using in-situ doping during the deposition process of the upper portion 106b of the material layer 106, as examples, although other doping methods may also be used. The dopant may be introduced after the lower portion 106a of the material layer 106 is formed, during the deposition process for the upper portion 106b of the material layer 106, for example. The dopant material may comprise a p or n type dopant, such as B, As, or P, as examples, although other dopant materials may also be used.

For example, the material 106 may comprise a gate material comprising an upper portion 106b comprising doped polysilicon and a lower portion 106a comprising undoped polysilicon, in some embodiments. The upper portion 106b may comprise about 700 Angstroms or less of polysilicon doped with B, As, or P, and the lower portion 106a may comprise about 700 Angstroms or more of undoped polysilicon, as examples, although alternatively, other materials and dimensions may also be used. The upper portion 106b may comprise about the top half of the material layer 106 thickness in some embodiments, for example.

In some embodiments, for example, the upper portion 106b comprises a material that is different than the lower portion 106a of the material 106. A material layer 106 comprising different materials for the upper portion 106b and the lower portion 106a may be advantageous because some etch selectivity between the upper portion 106b and the lower portion 106a may be provided, for example. However, in other embodiments, the upper portion 106b may comprise the same material as the lower portion 106a of the material layer 106.

In embodiments wherein the gate dielectric material 104a comprises a high k material, the upper portion 106b may not comprise a doped material, as another example. The upper portion 106b may comprise a polycrystalline semiconductive material such as polysilicon, and the lower portion 106a may comprise an amorphous semiconductive material such as amorphous silicon, in some embodiments, for example.

A hard mask 108 is formed over the material layer 106 to be patterned, e.g., over the material layer 106, as shown in FIG. 3. The hard mask 108 may comprise a nitride material layer, an oxide material layer, or combinations or multiple layers thereof, as examples, although other materials may also be used. The hard mask 108 may comprise a thickness of about 500 Angstroms or less, for example, although alternatively, the hard mask 108 may comprise other dimensions.

The hard mask 108 in some embodiments of the present invention may comprise a first layer of silicon dioxide having a thickness of about 50 Angstroms or less, and a second layer of silicon nitride having a thickness of about 450 Angstroms or less, as an example. The hard mask 108 material may comprise a material with a high etch selectivity to the material(s) of the material layer 106 to be patterned, for example. In some embodiments, the hard mask 108 may comprise a nitride material layer that is used as a mask for a later etch process, or as a stress-increasing or stress-reducing material layer for underlying regions of the semiconductor device 100, as examples. In other embodiments, the hard mask 108 may comprise a sacrificial layer that is later removed from over the material layer 106.

Figure 5:
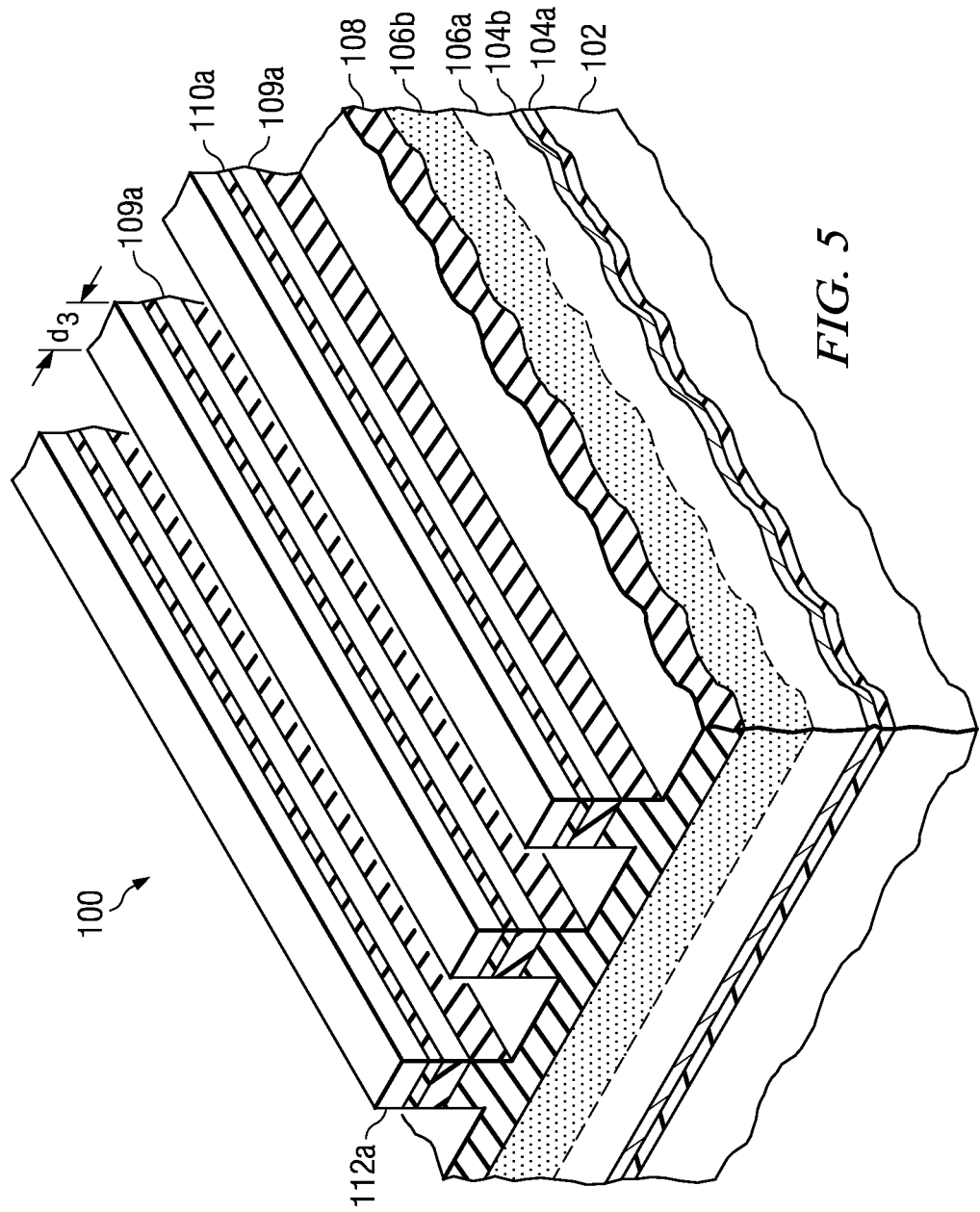
FIG. 5 shows a perspective view of the semiconductor device shown in FIG. 4.

The first pattern 107a of the first lithography mask 101a shown in FIG. 1 is formed in an upper portion of the hard mask 108 using a first etch process 114, as shown in FIG. 4 in a cross-sectional view and in a perspective view in FIG. 5. To pattern the hard mask 108, a first masking material 113a is formed over the hard mask 108, as shown in FIG. 3. The first masking material 113a may comprise a tri-layer photoresist in some embodiments. For example, the first masking material 113a may comprise an optional first optically dense layer (ODL) 109a comprising an organic material that may be optically reflective, for example, disposed over the hard mask 108. The first masking material 113a may include a first anti-reflective coating 110a disposed over the first ODL 109a, and a first layer of photosensitive material 112a such as a photoresist disposed over the anti-reflective coating 110a. The first anti-reflective coating 110a may comprise an organic material or an organic material comprising silicon, for example, although other materials may also be used.

The first masking material 113a is patterned with the first pattern of the first lithography mask 101a shown in FIG. 1 using the first lithography mask 101a, as shown in FIG. 4. The first pattern, also referred to herein as a first portion of a pattern, comprises substantially the same shape as the pattern 107a in the opaque material 105a of the first lithography mask 101a (e.g., before optional OPC structures, not shown, are added to the mask 101a), for example. The first pattern may comprise a dimension $d_3$ defined by the first pattern 107a of the first lithography mask 101a, wherein the dimension $d_3$ is defined by and is substantially the same as dimension $d_1$ of the opaque features 105a of the first lithography mask 101a, if a 1:1 lithography system is used, for example. Alternatively, the lithography system may comprise a reduction factor, such as 4:1, as an example, although other reduction factors may also be used. The first layer of photoresist 112a may be patterned with the first pattern, and the first layer of photoresist 112a may be used as a mask to open the first anti-reflective coating 110a and the first ODL 109a, as an example.

The first pattern formed in the first masking material 113a defines the width of gates formed in the material layer 106 when the first pattern is transferred to the material layer 106 in later processing steps. Note that the smaller side of gates such as gates 106 formed in the material layer 106 described herein are often referred to in the art as a "gate length." However, for purposes of discussion, the smaller side of the gates 106 are referred to herein as a width, and the longer side of the gates 106 formed in the material layer 106 are referred to herein as a length.

The first masking material 113a is exposed to light or energy through or reflected from the first lithography mask 101a to expose portions of the first layer of photoresist 112a not protected by the mask 101a, leaving portions of the first layer of photoresist 112a unexposed. The first layer of photoresist 112a is then developed, forming the first pattern or the first portion of the pattern in the first layer of photoresist 112a. Exposed portions of the first layer of photoresist 112a are then etched or stripped away, as shown in FIG. 4.

The first pattern of the first layer of photoresist 112a is transferred to the first anti-reflective coating 110a, the first ODL 109a, and an upper portion of the hard mask 108 using a first etch process 114, as shown in FIG. 4. The first layer of photoresist 112a is used as a mask to open, pattern, or etch away portions of anti-reflective coating 110a, the first ODL 109a, and to pattern the upper portion of the hard mask 108 using the first etch process 114, as shown in FIG. 4. The first etch process 114 may comprise different etch chemistries during the opening or patterning of the first anti-reflective coating 110a, the opening or patterning of the first ODL 109a, and the opening or patterning of the upper portion of the hard mask 108, for example. The first etch process 114 may comprise an end-point-detecting etch process and/or a timed etch process, as examples. If the hard mask 108 comprises a nitride material disposed over a thin oxide material layer, for example, an end point detector may be used to detect when the upper nitride material portion of the hard mask 108 has been completely etched through and the thin oxide material layer of the hard mask 108 has been reached, in some embodiments.

After the first etch process 114, an upper portion of the hard mask 108 comprising dimension $d_4$ comprises the first pattern, as shown in FIG. 4. Dimension $d_4$ of the upper portion of the hard mask 108 that is patterned with the first etch process 114 may comprise about 50% or greater of the thickness of the hard mask 108 in some embodiments. In other embodiments, dimension $d_4$ of the upper portion of the hard mask 108 that is patterned with the first pattern may comprise about 75 to 90% of the entire thickness of the hard mask 108, for example.

The first etch process 114 used to pattern the upper portion of the hard mask 108 may comprise a relatively aggressive etch process, comprising an etch chemistry such as a $CF_4$-based etch chemistry, as an example. The first etch process 114 may be performed at relatively high temperatures, such as at about 60 degrees C. or greater, as an example. Alternatively, other etch chemistries and temperatures may also be used for the first etch process 114, for example.

A portion of or the entire layer of photoresist 112a of the first masking material 113a may be consumed or removed during the first etch process 114 to pattern the upper portion of the hard mask 108 with the first pattern, not shown. The remaining first masking material 113a, e.g., any remaining first layer of photoresist 112a, the first anti-reflective coating 110a, and the first ODL 109a are then removed from over the workpiece 102.

Figure 6:
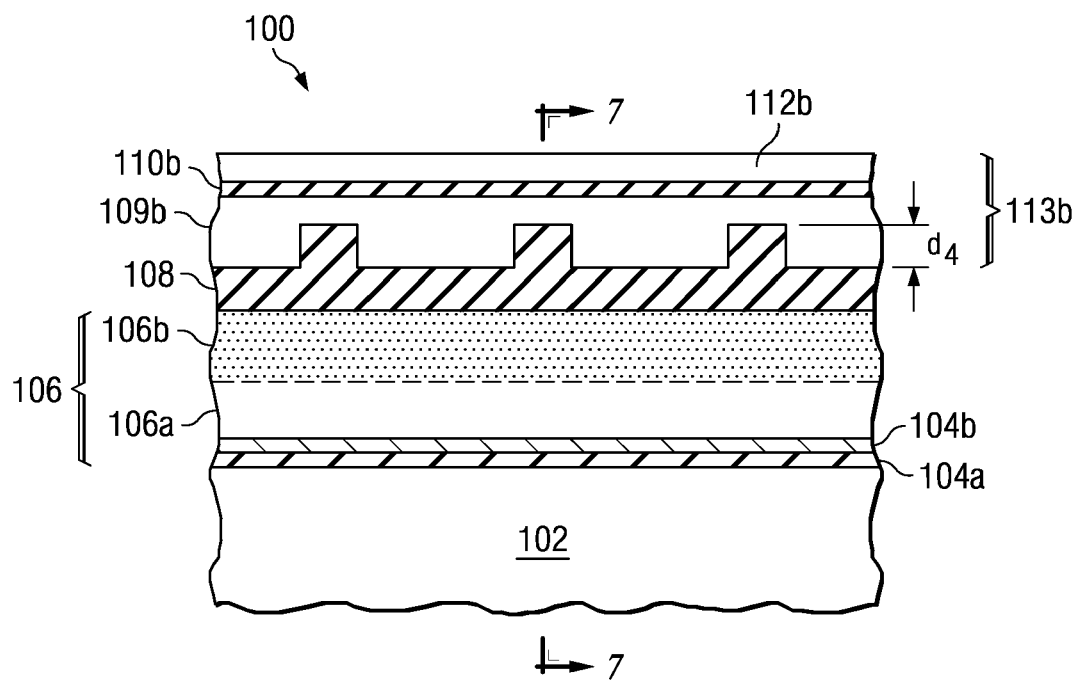
FIGS. 6 through 8 show cross-sectional views of a semiconductor device at various stages of manufacturing, wherein the lithography mask shown in FIG. 2 is used to pattern the upper portion of the hard mask with a second pattern.
Figure 7:
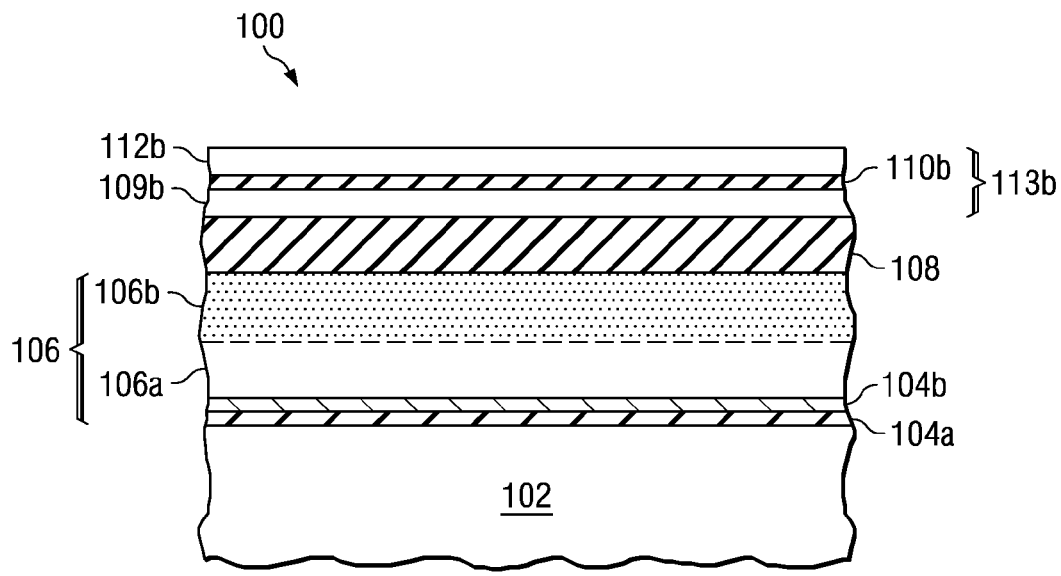
Figure 8:
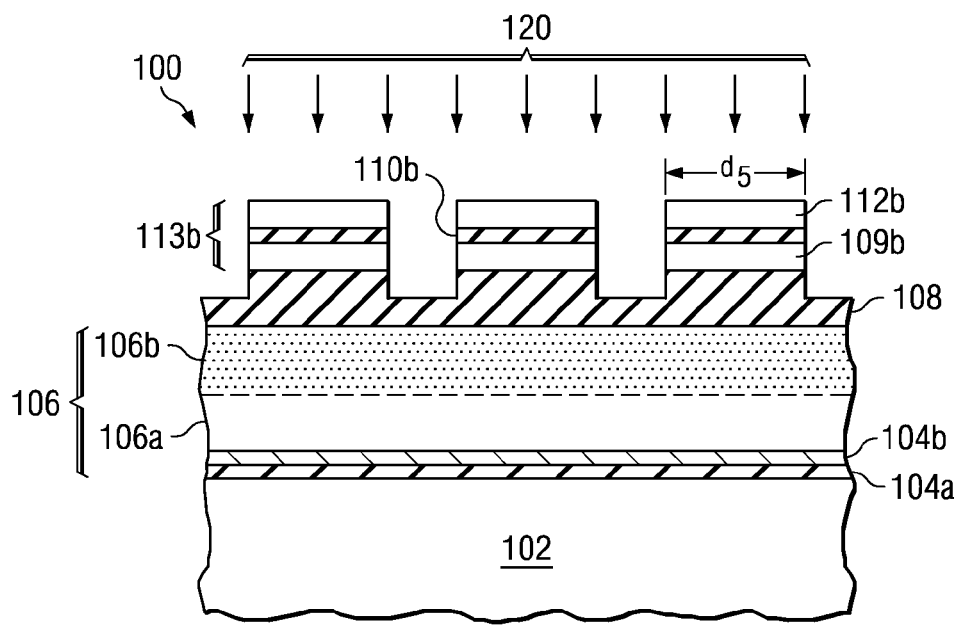
Figure 9:
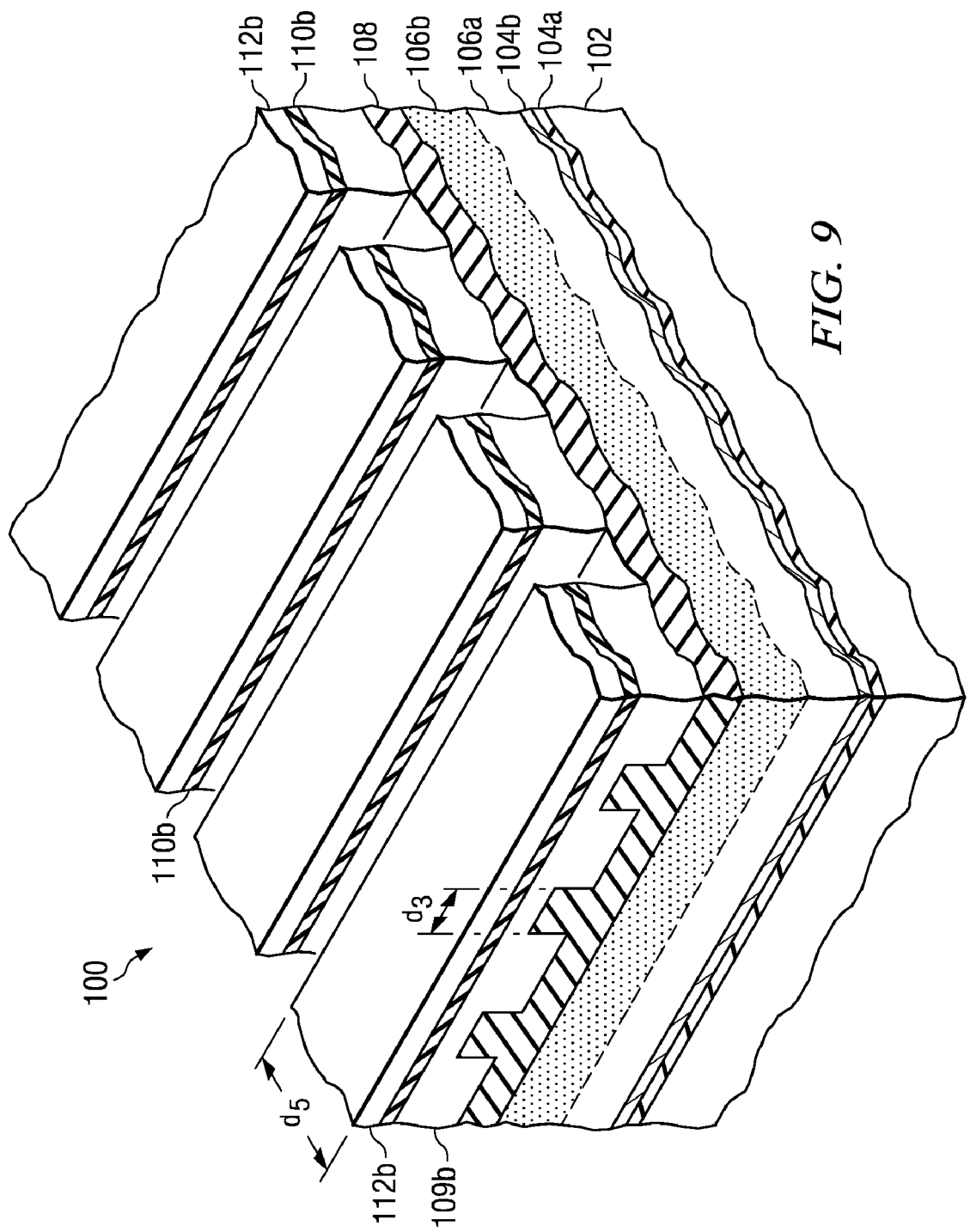
FIG. 9 shows a perspective view of the semiconductor device shown in FIG. 8.

Next, the second pattern 107b of the second lithography mask 101b shown in FIG. 2 is formed in the upper portion of the hard mask 108 using a second etch process 120, as shown in cross-sectional views in FIGS. 6 through 8, leaving the structure shown in a perspective view in FIG. 9. To pattern the upper portion of the hard mask 108 with the second pattern, a second masking material 113b is formed over the top surfaces of the hard mask 108 patterned with the first pattern and over the sidewalls of the patterned portions of the hard mask 108, as shown in FIG. 6. The second masking material 113b may comprise similar materials as described for the first masking material 113a, for example. The second masking material 113b may comprise a second tri-layer photoresist. The second masking material 113b may comprise a second ODL 109b, a second anti-reflective coating 110b disposed over the second ODL 109b, and a second layer of photosensitive material 112b such as a photoresist disposed over the second anti-reflective coating 110b. The second ODL 109b may comprise a substantially planar top surface, as shown in FIG. 6, wherein the second ODL 109b is thicker over the portions of the hard mask 108 patterned with the first pattern, and thinner over the unpatterned portions of the hard mask 108, as shown. If isolation regions such as shallow trench isolation (STI) regions (not shown in FIG. 6; see isolation regions 132 shown in FIG. 11) comprise a step height, the second ODL 109b may be thicker over the isolation regions, for example.

FIG. 7 shows a cross-sectional view of a portion of the semiconductor device 100 of FIG. 6 rotated by ninety degrees in a top view. FIG. 7 illustrates a cross-sectional view of a semiconductor device 100 at "7-7" in FIG. 6, for example. The second masking material 113b is patterned with the second pattern 107b of the second lithography mask 101b shown in FIG. 2 using the second lithography mask 101b, as shown in FIG. 8. The second pattern 107b formed in the second masking material 113b defines the length, e.g., the longer side, of gates formed in the material layer 106.

The second pattern 107b is different than the first pattern 107a. Thus, the second pattern of the upper portion of the hard mask 108 is different than the first pattern of the upper portion of the hard mask 108. The second pattern 107b, also referred to herein as a second portion of a pattern, comprises substantially the same shape (e.g., reduced by the reduction factor of the lithography system) as the pattern 107b in the opaque material 105b of the second lithography mask 101b (e.g., before optional OPC structures, not shown, are added to the mask 101b), for example. The second pattern may comprise a dimension $d_5$ defined by the second pattern 107b of the lithography mask 101b, wherein the dimension $d_5$ is defined by and is substantially the same as dimension $d_2$ of the opaque features 105b of the second lithography mask 101b, reduced by the reduction factor, for example. The second masking material 113b is exposed to light or energy through or reflected from the second lithography mask 101b to expose portions of the second layer of photoresist 112b not protected by the second lithography mask 101b, leaving portions of the second layer of photoresist 112b unexposed. The second layer of photoresist 112b is then developed, forming the second pattern or the second portion of the pattern in the second layer of photoresist 112b. Exposed portions of the second layer of photoresist 112b are then etched or stripped away. The second layer of photoresist 112b is then used as a mask to open or pattern the second anti-reflective coating 110b and the second ODL 109b.

The second pattern of the second masking material 113b is transferred to the upper portion of the hard mask 108 using a second etch process 120, as shown in FIG. 8, which shows the cross-sectional view of the semiconductor device 100 shown in FIG. 7 after the upper portion of the hard mask 108 is patterned using the second etch process 120. The layer of photoresist 112b is used as a mask to open, pattern, or etch away portions of the second ODL, the second anti-reflective coating 110b, and the upper portion of the hard mask 108 using the second etch process 120, as shown in FIG. 8. After the second etch process 120, the upper portion of the hard mask 108 comprises the second pattern in the cross-sectional view shown comprising dimension $d_5$ in FIG. 8.

In some embodiments, the second etch process 120 may comprise substantially the same etch process or processes that were used for the first etch process 114 shown in FIG. 4. In other embodiments, the second etch process 120 may comprise a different type of etch process than the first etch process 114, to be described further herein. The second etch process 120 may comprise different chemistries during the opening or patterning of the second anti-reflective coating 110b, the second ODL 109b, and the upper portion of the hard mask 108, for example. The second etch process 120 may comprise an end-point-detecting etch process and/or a timed etch process. If the hard mask 108 comprises a nitride material disposed over a thin oxide material layer, for example, an end point detector may be used to detect when the upper nitride material portion of the hard mask 108 has been completely etched through and the thin oxide material layer of the hard mask 108 has been reached, in some embodiments, for example.

The second etch process 120 used to pattern the upper portion of the hard mask 108 may comprise a relatively aggressive etch process, comprising an etch chemistry such as a $CF_4$-based etch chemistry, as an example. The second etch process 120 may be performed at relatively high temperatures, such as about 60 degrees C. or greater, as an example. Alternatively, other etch chemistries and temperatures may also be used for the second etch process 120, for example.

A portion of or the entire second layer of photoresist 112b may be consumed or removed during the second etch process 120 to pattern the upper portion of the hard mask 108 with the second pattern, not shown. The second masking material 113b, e.g., any remaining photoresist 112b, the second anti-reflective coating 110b, and the second ODL 109b are then removed from over the workpiece 102.

Next, a third etch process is used to transfer the first and second patterns formed in the upper portion of the hard mask 108 to the lower portion of the hard mask 108 and to the material layer 106, leaving the structure shown in a perspective view in FIG. 9. The third etch process may comprise different etch chemistries to etch the lower portion of the hard mask 108 and the various materials of the material layer 106. Each different etch chemistry may include an over-etch process for each material 106b, 106a, 104b, and 104a of the material layer 106, for example.

The third etch process may comprise a different type of etch process than the first and second etch processes 114 and 120. The third etch process may comprise a less aggressive etch process than the first and second etch processes 114 and 120 in some embodiments, as an example. The third etch process may comprise an HBr-based etch chemistry in some embodiments, although other etch chemistries may also be used for the third etch process. The third etch process may be performed at a lower temperature than the first etch process 114 and/or the second etch process 120 are performed at. In some embodiments, for example, portions of the third etch process may comprise a temperature of about 30 to 60 degrees C., although alternatively, the third etch process may be performed at other temperatures.

As one example, the third etch process may comprise a first etch process that may comprise an end-point-detecting etch process for etching the lower portion of the hard mask 108. The third etch process may include at least one second timed etch for etching layers 106b, 106a, 104b, and 104a of the material layer 106. If the hard mask 108 comprises a nitride material, for example, an end point detector may be used to detect when the hard mask 108 has been completely etched through, at which time other etch processes may be used to pattern material layers 106b and 106a and optional material layers 104b and 104a, respectively.

In some embodiments, the third etch process may comprise a final reactive ion etch process for the lower portion of the hard mask 108 and the material layer 106. The third etch process may comprise a hard mask 108 etch and an over-etch of the hard mask 108 material. A polysilicon etch process may be used to etch the material layer 106b and 106a, e.g., comprising an end point etch, so that the polysilicon etch process stops on the metal layer 104b. A metal layer 104b etch process may be used to etch the metal layer 104b, including an endpoint detection and an over-etch process. An etch process for the gate dielectric 104a may then be used to etch the gate dielectric 104a, e.g., comprising a high temperature etch process at about 150 to 300 degrees C., if the gate dielectric 104a comprises a high k material, for example. The gate dielectric 104a is then over-etched and cleaned, e.g., using a diluted hydrofluoric (DHF) acid wet cleaning or other type of cleaning step. Alternatively, the third etch process may comprise other combinations and types of etch processes, for example.

At this point in the manufacturing process flow for the semiconductor device 100, the material layer 106 has been patterned with the first and second patterns formed in the upper portion of the hard mask 108. Again, the second pattern may comprise a different pattern than the first pattern. The second pattern may define the lengths of a plurality of transistor gates or other features, represented by dimension $d_5$ in FIG. 9. The first pattern may define the widths of the plurality of transistor gates or other features, represented by dimension $d_3$. The second lithography mask 101b may be aligned during the lithography process such that the second pattern intersects with the first pattern previously formed within the upper portion of the hard mask 108.

Note that in some embodiments, the lower portion of the material layer 106, e.g., the gate dielectric material 104a, may not be patterned using the third etch process. For example, the gate dielectric material 104a may not be included in the material layer 106 that is patterned using the novel methods described herein (not shown in the drawings). The gate dielectric material 104a may be patterned in a later manufacturing step in these embodiments, for example. In other embodiments, the gate dielectric material 104 may be patterned using the hard mask 108 as a mask and using the third etch process, as shown in FIG. 9.

Advantageously, at least a portion of the third etch process used to pattern the lower portion of the hard mask 108 and the material layer 106 may comprise a less aggressive etch process than the first etch process 114 or the second etch process 120 in some embodiments, for example. Thus, the top surface of the workpiece 102, or the top surface of the gate dielectric material 104a, if the gate dielectric material 104a is not patterned, are not exposed to the more aggressive first and second etch processes 114 and 120. Thus, the lower portion of the hard mask 108 and the presence of material layers 106b and 106a and optional material layers 104b and 104a protects the workpiece 102 or the gate dielectric material 104 during the aggressive first and second etch processes 114 and 120. If the lower portion of the hard mask 108 and/or the material layer 106 were to be etched away during the patterning of the upper portion of the hard mask 108, then regions of the workpiece 102 or gate dielectric material 104a where the first pattern and the second pattern intersect would be exposed to two aggressive etch processes, e.g., the first and second etch processes 114 and 120, which would increase the likelihood that the workpiece 102 or gate dielectric material 104 would be etched away or punched through, which is undesirable in some applications, for example. Thus, in accordance with the novel embodiments of the present invention, damage or punch-through of the workpiece 102, the gate dielectric material 104, or other underlying material layers in non-transistor applications, is prevented.

Figure 11:
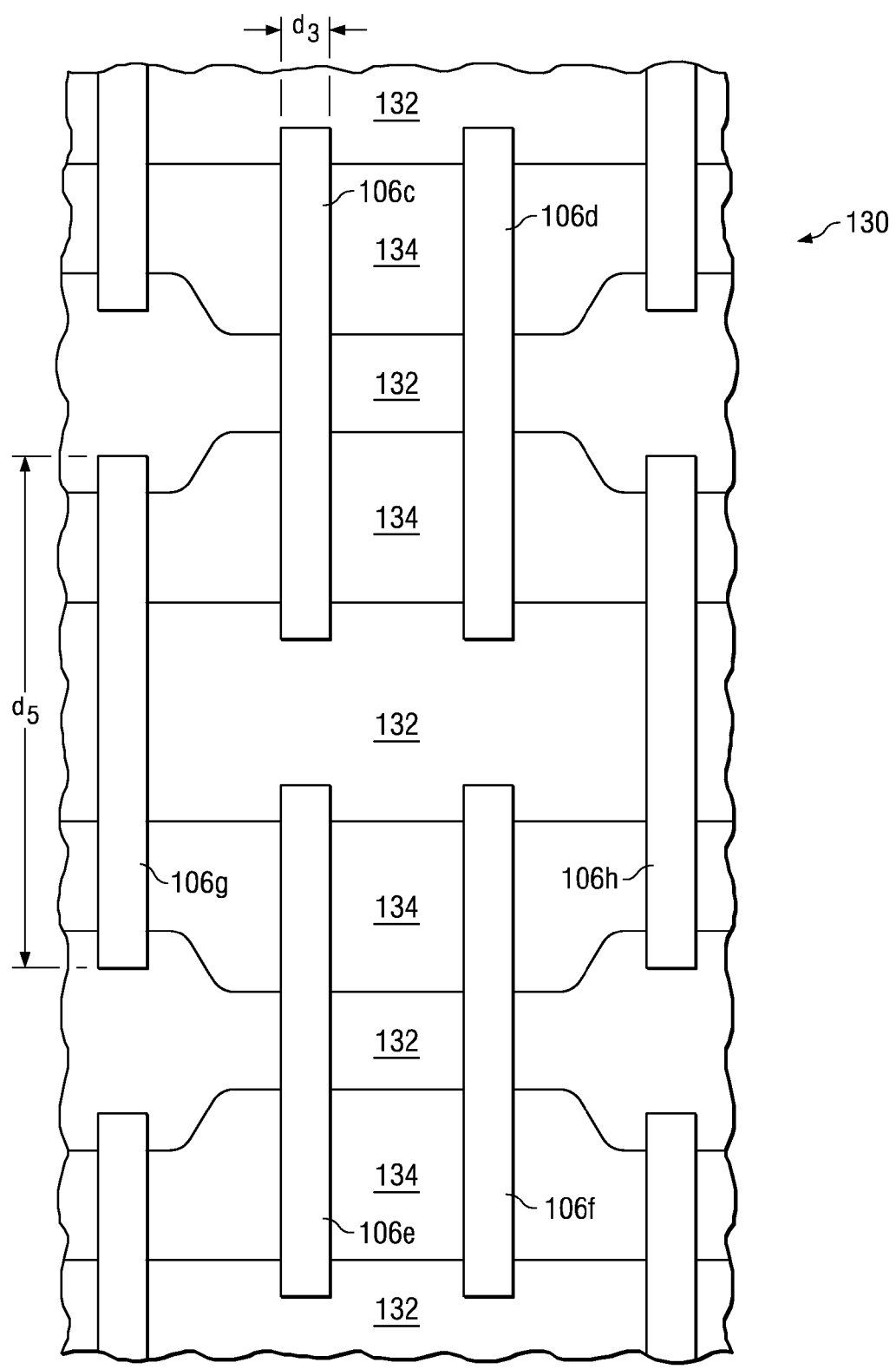
FIG. 11 shows a top view of a static random access memory (SRAM) device that has been patterned using the novel methods of embodiments of the present invention shown in FIGS. 3 through 10.

The second etch process 120 used to pattern the upper portion of the hard mask 108 may also include an overetch process of the second ODL layer 109b. Referring again to FIG. 6, the second ODL layer 109b comprises a greater thickness over portions of the hard mask 108 that were patterned with the first pattern than over unpatterned portions of the hard mask 108. The second ODL layer 109b may also comprise a greater thickness over isolation regions 132 formed in the workpiece 102, as shown in FIG. 11, if the isolation region 132 top surface is recessed below a top surface of the workpiece 102. Thus, the second etch process 120 may include an overetch process of the second ODL layer 109b to remove the lower portion of the ODL layer 109b over portions of the hard mask 108 that have been previously patterned with the first pattern or the lower portions of the ODL layer 109b over the recessed isolation regions 132. The overetch process of the second ODL layer 109b may be advantageous in some applications, because punch-through of the gate dielectric 104a or workpiece 102 is prevented, because the lower portion of the hard mask 108 and the material layers 106b, 106a and optional 104b and 104a are present during the patterning of the upper portion of the hard mask 108 with the second pattern.

The OLD layer 109b over-etch process may comprise about 60% or less of an over-etch process of the second etch process 120, depending on the amount of the step height of the isolation regions 132 and/or the unpatterned portions of the hard mask 108, for example. The portion of the second etch process 120 comprising the OLD layer 109b over-etch process may comprise a selective $HBr/O_2$ or $HBr/Cl_2/O_2$ reactive ion etch process in some embodiments, for example. The over-etch process of the OLD layer 109b portion of the second etch process 120 may ensure that all materials 106b, 106a, 104b, and 104a of the material layer 106 to be patterned are etched through completely using the third etch process, for example.

In some embodiments, the upper and lower portions 106b and 106a, and optionally also the metal layer 104b, of the material layer 106 patterned with the first pattern and the second pattern may comprise a plurality of transistor gates, for example, although a plurality of other types of features may also be formed in the material layer 106 using the novel methods described herein.

Figure 10:
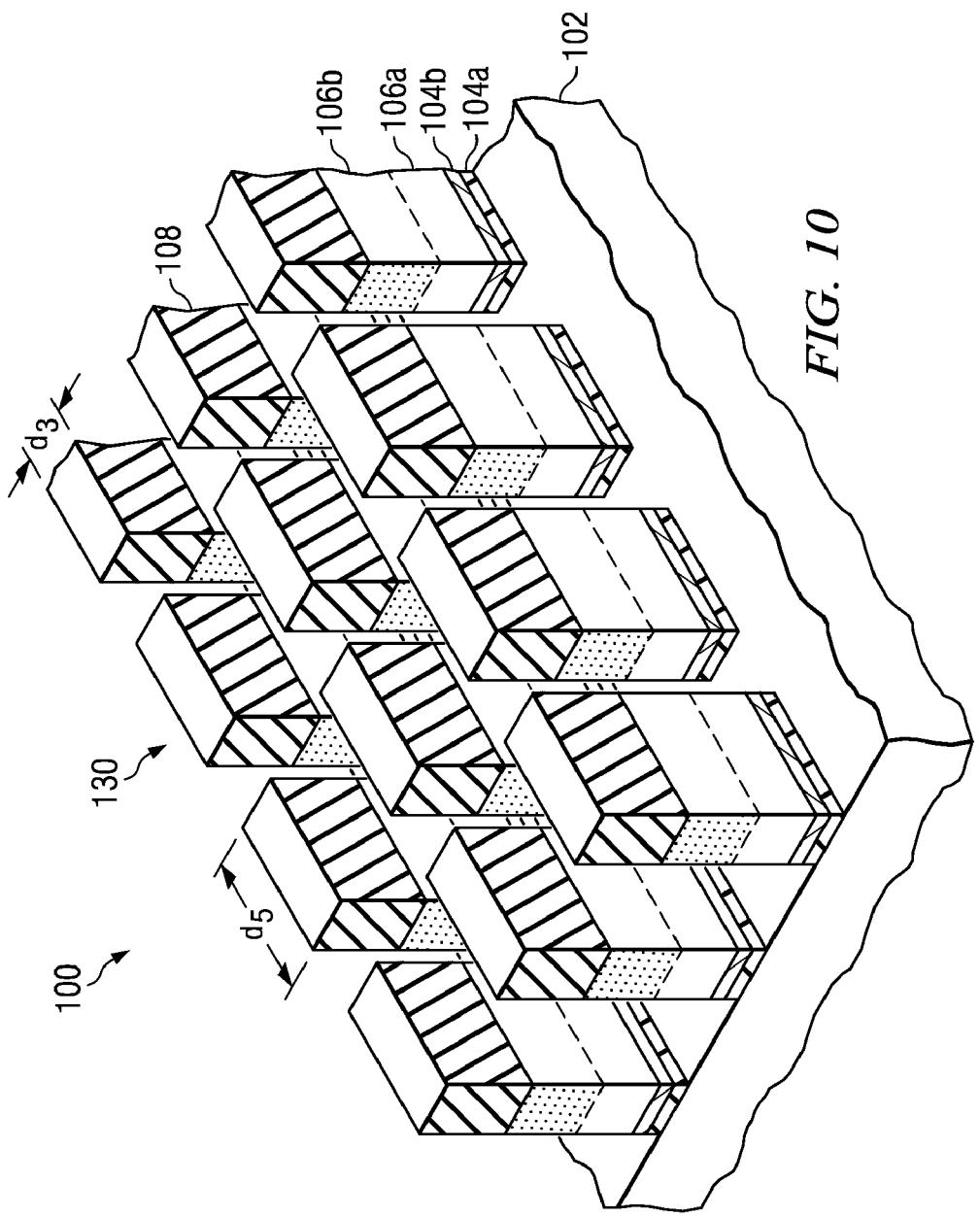
FIG. 10 shows a perspective view of the semiconductor device shown in FIG. 9 after a masking material has been removed from over the hard mask and after the lower portion of the hard mask and the material layer have been patterned with the first pattern and the second pattern.

After the second etch process, the second masking material 113b is removed from over the hard mask 108, as shown in a perspective view in FIG. 10.

In the embodiment shown in FIGS. 1 through 10, the first pattern 107a of the mask 101a of FIG. 1 may be first patterned into the upper portion of the hard mask 108, and then the second pattern 107b of the mask 101b of FIG. 2 may be patterned into the upper portion of the hard mask 108. Alternatively, the second pattern 107b of the mask 101b of FIG. 2 may be first patterned into the upper portion of the hard mask 108, and then the first pattern 107a of the mask 101a of FIG. 1 may be patterned into the upper portion of the hard mask 108.

In some embodiments, the material layer 106 patterned with the first pattern and the second pattern may comprise a plurality of transistor gates of complementary metal oxide semiconductor (CMOS) devices, which utilize p channel metal oxide semiconductor (PMOS) field effect transistors (FETs) and n channel metal oxide semiconductor (PMOS) field effect transistors (FETs) in a complementary arrangement. Thus, transistor gates comprising gates of PMOS FETs and NMOS FETs may be fabricated using the novel methods described herein.

In some embodiments, the material layer 106 patterned with the first pattern and the second pattern may comprise a plurality of transistor gates of a static random access memory (SRAM) device. For example, an SRAM device comprises a memory device that uses both PMOS FETs and NMOS FETs. A typical SRAM device may include arrays of thousands of SRAM cells, with each SRAM cell having four or six transistors, for example. A commonly used SRAM cell is a six-transistor (6T) SRAM cell, which has two PMOS FETs interconnected with four NMOS FETs, as an example.

FIG. 11 shows a top view of an SRAM device 130 that has been patterned using the novel methods of embodiments of the present invention shown in FIGS. 1 through 10, for example. To manufacture the SRAM device 130, a workpiece 102 is provided (see FIG. 1), and a plurality of isolation regions 132 are formed in the workpiece 102. The isolation regions 132 may be formed by etching trenches in the workpiece 102 and filling the trenches with insulating materials and liners, for example. A plurality of active areas 134 are formed in the workpiece 102 between the plurality of isolation regions 132, as shown. The active areas 134 may be formed by implanting dopant materials into the workpiece 102 and annealing the workpiece 102, for example. Alternatively, the active areas 134 may be formed by etching holes or trenches in the workpiece 102 and forming semiconductive materials in the holes or trenches, e.g., such as by epitaxial growth or deposition. The active areas 134 may comprise source and drain regions of the transistors of the SRAM device 130, for example.

A material layer 106 including a gate dielectric material 104a is formed over the workpiece 102, the isolation regions 132, and the active areas 134. A hard mask 108 is formed over the material layer 106, and the hard mask 108 is patterned using the novel methods previously described with reference to FIGS. 1 through 10 herein, forming gates 106c, 106d, 106e, 106f, 106g, and 106h comprising the material layer 106 of the SRAM device 130.

The top view of the SRAM device 130 illustrates that the rows and columns of the transistor gate 106c, 106d, 106e, 106f, 106g, and 106h patterns may be staggered, e.g., in alternating rows or columns in pairs, as shown. Alternatively, the patterns for features formed using embodiments of the present invention may be aligned singularly or in pairs in rows and columns, for example, not shown. The features may also be arranged in other configurations, for example.

The SRAM device 130 may comprise six transistors comprising gates 106c, 106d, 106e, 106f, 106g, and 106h, for example. Gates 106c and 106d may comprise gates of NFET devices and may be n-doped, and gates 106e, 106f, 106g, and 106h may comprise gates of PFET devices and may be p-doped, for example, although alternatively, the SRAM device 130 may comprise other configurations. The SRAM device 130 shown in the top view in FIG. 11 comprises a single SRAM cell and portion of other SRAM cells; however, a plurality of SRAM cells may be manufactured on a single semiconductor device 100 in accordance with embodiments of the present invention. SRAM device 130 comprising different numbers of transistors may also be fabricated using the novel methods described herein, for example.

Advantageously, because the lithography mask 101b shown in FIG. 2 may comprise a cutter mask that comprises a pattern that is substantially rectangular in some embodiments, the ends of the transistor gates 106c, 106d, 106e, 106f, 106g, and 106h formed in the material layer 106 may be flat or squared, which may be advantageous in some applications, for example, as shown in FIG. 11. The ends of the transistor gates 106c, 106d, 106e, 106f, 106g, and 106h formed in the material layer 106 defined by the second lithography mask 101b advantageously may comprise substantially flat edges, as shown, for example, in some embodiments. Thus, corner rounding of gate 106c, 106d, 106e, 106f, 106g, and 106h ends is avoided by the use of embodiments of the present invention. Improved control of the amount of overhang of the transistor gate 106c, 106d, 106e, 106f, 106g, and 106h ends, e.g., over isolation regions 132, is also provided by embodiments of the present invention.

After the embodiments of the present invention shown in FIGS. 10 and 11, further processing of the semiconductor device 100 and/or SRAM device 130 is continued to complete the fabrication process. For example, the hard mask 108 may be removed or may be left remaining in the structure. Insulating material layers may be formed over the patterned material layer 106 and/or hard mask 108, and contacts may be formed in the insulating layers to make contact to portions of the semiconductor devices 100 or SRAM devices 130, such as the sources, drains, and gates. Conductive material layers may be formed over the devices to provide electrical connection to the contacts and between various circuit components formed on the semiconductor devices 100 or SRAM devices 130, for example, not shown.

In some embodiments, three or more lithography masks may be used to pattern the upper portion of the hard mask 108 with at least one first pattern and/or at least one second pattern, using three or more etch processes, for example. The patterning of the upper portion of the hard mask 108 in accordance with embodiments of the present invention is not limited to only two patterns, as shown in the drawings. A plurality of first patterns and/or second patterns may be formed in the upper portion of the hard mask 108, and then the plurality of patterns may be transferred to the lower portion of the hard mask 108 and the material layer 106 using an additional, final etch process.

Figure 12:
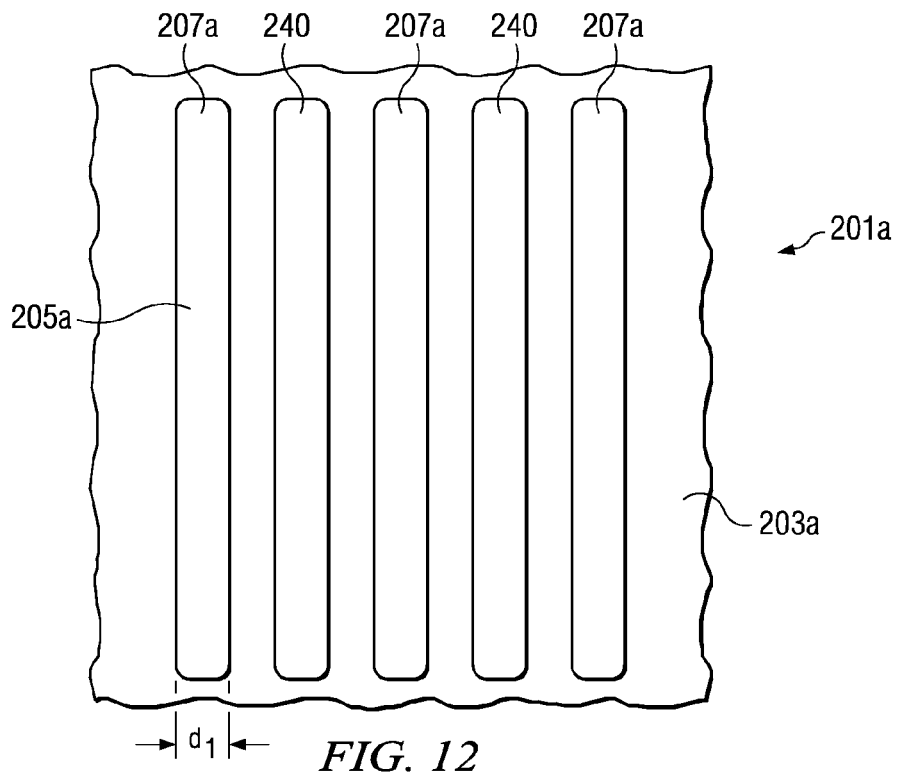
FIGS. 12 and 13 show top views of lithography masks in accordance with another embodiment of the present invention, wherein one mask comprises a width-defining mask for features and assist lines and the other mask comprises patterns for defining the lengths of the features and for removal of the assist lines.
Figure 13:
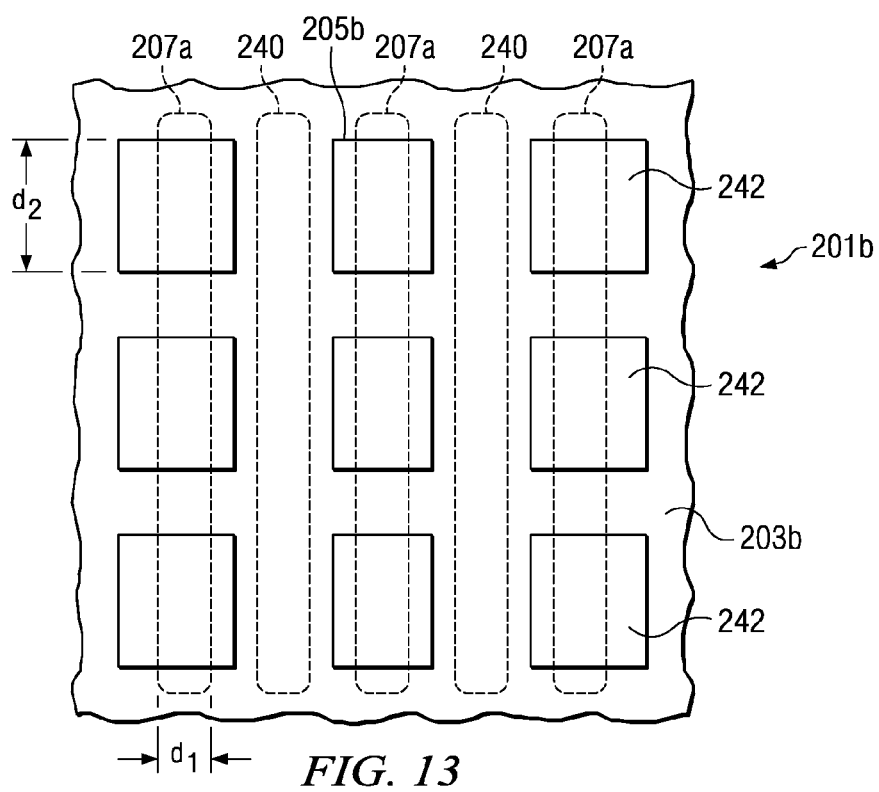

FIGS. 12 and 13 show top views of lithography masks 201a and 201b in accordance with another embodiment of the present invention, wherein one mask 201a comprises a width-defining mask for features and assist lines and the other mask 201b comprises patterns 242 for defining the lengths of the features and also for removal of the assist lines. Like numerals are used for the various elements that were used to describe FIGS. 1 through 11, and to avoid repetition, each reference number shown in FIGS. 12 and 13 is not described again in detail herein. Rather, similar materials x02, x04, x06, x08, etc. . . . may be used for the various material layers shown as were used to describe FIGS. 1 through 11, where x=1 in FIGS. 1 through 11 and x=2 in FIGS. 12 and 13.

The lithography mask 201a shown in FIG. 12 includes patterns 207a for features of a semiconductor device 200 and patterns 240 for assist lines disposed between the patterns 207a for the features of the semiconductor device 200. The patterns 207a and 240 may comprise a width or dimension $d_1$ comprising a minimum feature size or critical dimension (CD) of the semiconductor device 200, and may be spaced apart by the same width or dimension $d_1$, for example. The assist line patterns 240 may improve the lithography process used to pattern the features.

The lithography mask 201b of FIG. 13 illustrates in phantom an overlay of the patterns 242 in the mask 201b with the patterns 207a and 240 of the mask 201a shown in FIG. 12. For example, patterns 242 intersect with portions of the patterns 207a for features, but not with the patterns 240 for the assist lines. Thus, the mask 201b may be used to remove assist features formed by the patterns 240 for the assist features and also for defining the ends of features formed by the patterns 207a.

Figure 14:
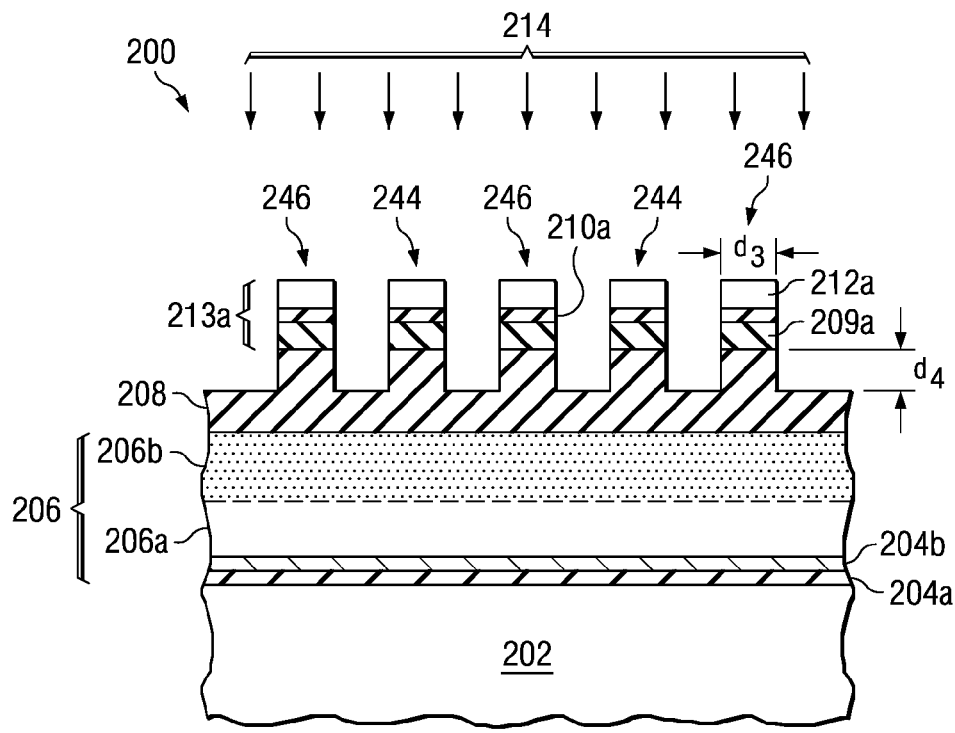
FIG. 14 shows a cross-sectional view of a semiconductor device, wherein assist lines are formed between features using the lithography mask shown in FIG. 12.

FIG. 14 shows a cross-sectional view of a semiconductor device 200, wherein features 246 are formed by patterns 207a for features and assist lines 244 are formed between features 246 using the lithography mask 201a shown in FIG. 12. A semiconductor device 200 is shown after the manufacturing process step shown in FIG. 3, wherein the mask 201a of FIG. 2 has been used to form a pattern for features 246 and the assist lines 244 in the upper portion of the hard mask 208 using a first etch process 214. Pitch variations may create uncertainty in the size of features 246 patterned, because of through-pitch behavior. The assist lines 244 may comprise printing assist features (PrAF) adapted to improve the lithography process and across-the-chip line-width variance (ACLV), for example.

Figure 15:
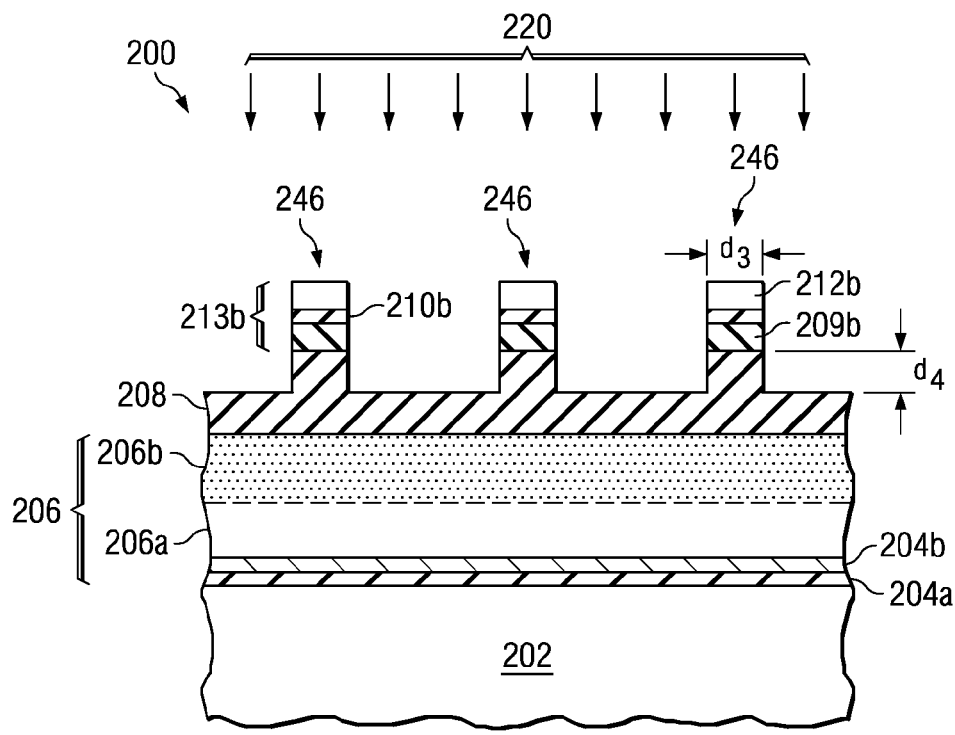
FIG. 15 shows the cross-sectional view of the semiconductor device shown in FIG. 14 after the removal of the assist lines using the lithography mask shown in FIG. 13.

The lithography mask 201b of FIG. 13 may also be used for PrAF removal, e.g., of the assist lines 244. FIG. 15 shows the cross-sectional view of the semiconductor device 200 shown in FIG. 14 after the removal of the pattern for the assist lines 244 in the upper portion of the hard mask 208 using the lithography mask 201b shown in FIG. 13 using a second etch process 220. The lithography mask 201b functions as a cutter mask that is adapted to not only define the ends of the features (not shown in FIGS. 14 and 15; see FIGS. 8 and 9) but also adapted to remove the assist line patterns formed in the upper portion of the hard mask 208. Note that the assist lines 244 are not actually formed in the material layer 206: the assist lines 244 are removed from the hard mask 208 before the patterning of the material layer 206. The patterns formed in the hard mask 208 are then transferred to the lower portion of the hard mask 208 and to the material layer 206 using a third etch process, as described with regard to the previous embodiments.

Embodiments of the present invention described herein comprise novel manufacturing and patterning methods, and methods of processing semiconductor devices 100 and 200. Embodiments of the present invention also include semiconductor devices 100, 130, and 200 patterned using the novel methods described herein, for example.

Novel methods of patterning features of a semiconductor device 100 and 200 have been described herein that utilize at least two lithography masks 101a, 101b, 201a, and 201b, at least two masking material layers 113a, 113b, 213a, and 213b, and at least three etch processes 114, 120, 214, and 220 (the third etch process is not labeled in the drawings). At least one lithography mask 101a and 201a shown in FIGS. 1 and 12 may comprise at least a portion of a pattern in opaque material 105a and 205a for lengthwise portions of gate electrodes, for example, defining the width (dimension $d_3$) of gates formed in the material layer 106 and 206, but not the lengths. The patterns in the opaque material 105a and 205a of the first masks 101a and 201a may comprise patterns for a plurality of elongated transistor gates, for example. The other at least one lithography masks 101b and 201b shown in FIGS. 2 and 13 may comprise a cutter mask that is adapted to define at least a portion of the lengths (dimension $d_5$) of the gates formed in the material layers 106 and 206, e.g., the ends of the gates in a lengthwise direction. The patterns in the opaque material 105b and 205b of the second masks 101b and 201b may comprise at least a portion of a pattern for defining the length and ends of the plurality of elongated transistor gates patterned by the first masks 101a and 201a, for example. The patterns in the opaque material 205b of the second mask 201b may also be adapted to remove patterns for assist lines formed in the hard mask 208 by the patterns 240 for assist lines in the first mask 201a of FIG. 12, for example.

Because the upper portions 106b and 206b of the material layer 106 may comprise a different material than the lower portions 106a and 206a, the third etch process used to pattern the material layer 106 and 206 is made easier in some embodiments, because etch selectivity may be provided, further assisting in preventing punch-through of the workpiece 102 or 202 or the gate dielectric material 104a and 204a during the third etch process used to pattern the material layer 106 and 206. Because the third etch process may comprise a less aggressive etch process in some embodiments, punch-through is avoided in regions (e.g., in the assist feature regions in the embodiments shown in FIGS. 12 through 15) that may otherwise be exposed to an etch process twice, (e.g., the first and second etch processes 114, 120, 214, and 220), to an aggressive etch process, or to an etch process of a material layer having a step height. Thus, punch-through through the gate dielectric material 104a and 204a, into the workpiece 102 or 202, or other material layers during the first and second etch processes 114, 120, 214, and 220 is avoided by embodiments of the present invention.

The portions of the second etch processes 120 and 220 for the ODL layers 109b and 209b may comprise high etch selectivity to the materials of the hard mask 108 and 208, e.g., which may comprise oxide materials in some embodiments, providing the ability to over-etch the second ODL layers 109b and 209b without resulting in punch-through, e.g., especially in the assist line regions of the workpiece 202 in the embodiment shown in FIGS. 12 through 15.

In addition, the use of a trilayer resist is also not required for the masking materials 113a, 113b, 213a, and 213b, because the thicker material layer 106 or 206 is not etched away or patterned until the final, third etch process. However, alternatively, the masking materials 113a, 113b, 213a, and 213b may comprise trilayer resists in some embodiments, for example. Furthermore, the masking materials 113a, 113b, 213a, and 213b may be made thinner, because only a portion of the hard mask 108 and 208 is patterned using the masking materials 113a, 113b, 213a, and 213b, rather than the entire hard mask 108 and 208 thickness or the entire thickness of the material layers 106 and 206.

Another advantage of embodiments of the present invention is improving the integrity of the pattern transfer, forming crisp, clean features in the material layer 106. The first and second etch processes 114, 120, 214, and 220 are performed in a relatively small aspect ratio material, e.g., only in the upper portion of the hard mask 108 and 208 rather than the entire thickness of the hard mask 108 and 208 and material layer 106 or 206, which has a higher aspect ratio.

The timing of the first and second etch processes 114, 120, 214, and 220 through the upper portion of the hard mask 108 and 208 is facilitated because of the decreased thickness of the portion of the hard mask 108 and 208 etched. Furthermore, the third etch process is also made easier and is improved because the same thickness of hard mask 108 and 208 is required to be etched away during the first portion of the third etch process. The improved timing control further facilitates the protection of the gate dielectric material 104a and 204a from harsh etch processes, and reduces the likelihood of punch-through or damage of the workpiece 102 and 202 and/or the gate dielectric material 104a and 204a, for example. The improved timing control provided by embodiments of the present invention also preserves the profile of features formed, e.g., of the gates formed in the material layer 106 and 206.

Patterning the upper portion of the hard mask 108 and 208 with the first pattern and the second pattern, and then using a third, separate etch process to transfer the first and second patterns to the lower portion of the hard mask 108 and 208 and the material layer 106 and 206 in accordance with embodiments of the present invention also results in improved fidelity in the pattern transfer from the at least one first lithography mask 101a and 201a and the at least one second lithography mask 201a and 201b described herein to the material layers 106 and 206, for example.

Embodiments of the present invention have been described herein for applications that utilize a positive photoresist, wherein the patterns transferred to the photoresists 113a, 113b, 213a, and 213b and also the material layers 106 and 206 are the same patterns on the lithography masks 101a, 110b, 201a, and 201b. Embodiments of the present invention may also be implemented in applications where negative photoresists 113a, 113b, 213a, and 213b are used, e.g., wherein the patterns transferred to the photoresists 113a, 113b, 213a, and 213b and the material layers 106 and 206 comprise reverse images of the patterns on the lithography masks 101a, 101b, 201a, and 201b.

Advantageously, because a hard mask 108 and 208 is used in the novel patterning methods described herein, a wide range of materials may be used for the material layer 106 and 206 to be patterned. For example, some conductors such as metals require a hard mask to pattern them, and such materials cannot be patterned using photoresist alone. Thus, in accordance with embodiments of the present invention, the material layers 106 and 206 may comprise a semiconductive material, a metal, or combinations thereof, allowing compatibility in semiconductor designs that require or would benefit from a metal as a gate material, for example.

The novel lithography methods and semiconductor device 100 and 200 manufacturing methods described herein may be used to fabricate many types of semiconductor devices 100 and 200, including memory devices and logic devices, as examples, although other types of semiconductor devices, integrated circuits, and circuitry may be fabricated using the novel embodiments of the present invention described herein. Embodiments of the present invention may be implemented in lithography systems using light at wavelengths of 248 nm or 193 nm, for example, although alternatively, other wavelengths of light may also be used. The lithography masks 101a, 101b, 201a, and 201b described herein may comprise binary masks, phase-shifting masks, attenuating masks, dark field, bright field, transmissive, reflective, or other types of masks, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning features, the method comprising:
   providing a workpiece having a material layer disposed thereon;
   forming a hard mask over the material layer;
   forming a first pattern in an upper portion of the hard mask;
   forming a second pattern in the upper portion of the hard mask; and
   forming the first pattern and the second pattern in a lower portion of the hard mask and the material layer, forming the features in the material layer, wherein forming the first pattern in the upper portion of the hard mask and forming the second pattern in the upper portion of the hard mask comprise forming the first pattern and the second pattern in about 50% or greater of a thickness of the hard mask.

2. The method according to claim 1, wherein forming the second pattern comprises forming a different pattern than the first pattern.

3. The method according to claim 1, wherein forming the first pattern and forming the second pattern comprise forming a first pattern and a second pattern that intersect.

4. The method according to claim 1, wherein forming the first pattern and forming the second pattern in the material layer comprise forming features comprising a plurality of transistor gates.

5. The method according to claim 1, wherein forming the first pattern and forming the second pattern in the material layer comprise forming features comprising a plurality of transistor gates of a static random access memory (SRAM) device.

6. The method according to claim 1, wherein forming the first pattern comprises a first etch process, wherein forming the second pattern comprises a second etch process, and wherein forming the first pattern and the second pattern in a lower portion of the hard mask and the material layer comprises a third etch process.

7. The method according to claim 1, wherein forming the hard mask comprises forming a nitride material layer, an oxide material layer, or combinations or multiple layers thereof.

8. A method of patterning a material layer of a semiconductor device, the method comprising:
   providing a workpiece, the workpiece comprising a material layer to be patterned disposed thereon;
   forming a hard mask over the material layer;
   forming a first masking material over the hard mask;

patterning the first masking material with a first pattern;

transferring the first pattern of the first masking material to an upper portion of the hard mask using a first etch process;

removing the first masking material;

forming a second masking material over the hard mask;

patterning the second masking material with a second pattern, the second pattern being different than the first pattern;

transferring the second pattern of the second masking material to the upper portion of the hard mask using a second etch process; and transferring the first pattern and the second pattern to a lower portion of the hard mask and the material layer using a third etch process, wherein forming the first masking material or forming the second masking material comprises forming a tri-layer photoresist.

9. The method according to claim 8, wherein forming the first masking material or forming the second masking material comprises forming an anti-reflective coating and forming a photosensitive material over the anti-reflective coating.

10. The method according to claim 9, wherein forming the first masking material or forming the second masking material further comprises forming an optically dense layer (ODL), before forming the anti-reflective coating.

11. The method according to claim 10, wherein forming the second masking material comprises forming an ODL layer, wherein the ODL layer comprises a greater thickness over patterned portions of the hard mask than over unpatterned portions of the hard mask or over an isolation region disposed within the workpiece, wherein the second etch process includes an over-etch process of the ODL layer.

12. The method according to claim 11, wherein a portion of the second etch process comprising the OLD layer over-etch process comprises a selective $HBr/O_2$ or $HBr/Cl_2/O_2$ reactive ion etch (RIE) process, or wherein the OLD layer over-etch process comprises about a 60% or less over-etch process.

13. The method according to claim 8, wherein forming the first pattern in the upper portion of the hard mask and forming the second pattern in the upper portion of the hard mask comprise forming the first pattern and the second pattern in about 75 to 90% of the upper portion of the hard mask.

14. The method according to claim 8, wherein forming the material layer comprises forming a conductive material, a metal, a semiconductive material, an insulator, or multiple layers or combinations thereof.

15. The method according to claim 8, wherein forming the material layer comprises forming an amorphous semiconductive material and forming a polycrystalline semiconductive material over the amorphous semiconductive material.

16. A method of manufacturing a semiconductor device, the method comprising:

providing a workpiece;

forming a material layer over the workpiece;

forming a hard mask over the material layer;

disposing a first masking material over the hard mask;

patterning the first masking material using a first lithography mask, forming a first portion of a pattern in the first masking material;

forming the first portion of the pattern in an upper portion of the hard mask using the first masking material as a mask and using a first etch process;

removing the first masking material;

disposing a second masking material over the patterned hard mask;

patterning the second masking material using a second lithography mask, forming a second portion of a pattern in the second masking material;

forming the second portion of the pattern in the upper portion of the hard mask using the second masking material as a mask and using a second etch process;

removing the second masking material; and forming the first portion of the pattern and the second portion of the pattern in a lower portion of the hard mask and forming the first portion of the pattern and the second portion of the pattern in the material layer using the upper portion of the hard mask as a mask and using a third etch process, wherein forming the first pattern and forming the second pattern in the material layer comprise forming features comprising a plurality of transistor gates.

17. The method according to claim 16, wherein forming the first portion of the pattern in the first masking material comprises forming a pattern for a plurality of elongated transistor gates and wherein forming the second portion of the pattern in the second masking material comprises forming a pattern for defining length and ends of the plurality of elongated transistor gates of the first portion of the pattern.

18. The method according to claim 17, wherein forming the first portion of the pattern in the first masking material further comprises forming a pattern for assist lines proximate and parallel to the pattern for the plurality of elongated transistor gates, and wherein forming the second portion of the pattern in the second masking material further comprises forming a pattern for removing the assist lines.

19. The method according to claim 16, wherein forming the second portion of the pattern in the first masking material comprises forming a second portion of a pattern comprising a pattern for a plurality of elongated transistor gates and wherein forming the first portion of the pattern in the first masking material comprises forming a first portion of a pattern comprising a pattern for defining length and ends of the plurality of elongated transistor gates of the second portion of the pattern.

20. The method according to claim 16, wherein providing the workpiece comprises providing a workpiece having a plurality of isolation regions formed thereon and a plurality of active areas disposed in the workpiece between the plurality of isolation regions, wherein forming the material layer comprises forming a gate dielectric material over the workpiece and forming a gate material over the gate dielectric material, wherein forming the first portion of the pattern and the second portion of the pattern in the material layer comprises forming the first portion of the pattern and the second portion of the pattern in at least the gate material.

21. The method according to claim 20, wherein forming the first portion of the pattern and the second portion of the pattern in the material layer further comprises forming the first portion of the pattern and the second portion of the pattern in the gate dielectric material.

22. The method according to claim 16, wherein the third etch process comprises a first etch chemistry for forming the first portion of the pattern and the second portion of the pattern in the lower portion of the hard mask and at least one second etch chemistry for forming the first portion of the pattern and the second portion of the pattern in the material layer.

23. A method of patterning features, the method comprising:

providing a workpiece having a material layer disposed thereon;

forming a hard mask over the material layer;

forming a first pattern in an upper portion of the hard mask;

forming a second pattern in the upper portion of the hard mask; and forming the first pattern and the second pattern in a lower portion of the hard mask and the material layer, forming the features in the material layer, wherein forming the first pattern and forming the second pattern in the material layer comprise forming features comprising a plurality of transistor gates.

24. The method according to claim 23, wherein forming the hard mask comprises forming a nitride material layer, an oxide material layer, or combinations or multiple layers thereof.

25. The method according to claim 23, wherein forming the first pattern comprises a first etch process, wherein forming the second pattern comprises a second etch process, and wherein forming the first pattern and the second pattern in a lower portion of the hard mask and the material layer comprises a third etch process.

* * * * *